United States Patent [19]

Sauer et al.

[11] Patent Number: 5,828,985
[45] Date of Patent: Oct. 27, 1998

[54] SEMICONDUCTOR TEST SYSTEM

[75] Inventors: Robert F. Sauer; Jun Makino; Hiroaki Yamoto, all of Santa Clara, Calif.

[73] Assignee: Advantest Corp., Tokyo, Japan

[21] Appl. No.: 754,230

[22] Filed: Nov. 20, 1996

[51] Int. Cl.[6] ................................................. G06F 11/00
[52] U.S. Cl. ..................... 702/122; 702/123; 371/25.1; 371/27.1
[58] Field of Search ..................................... 364/579, 580, 364/280; 395/183.15, 500; 371/22.1, 25.1, 22.34, 27.5, 22.6, 27.1; 702/121, 122, 123

[56] References Cited

U.S. PATENT DOCUMENTS

| | | | |
|---|---|---|---|
| 4,631,724 | 12/1986 | Shimizu | 371/22.1 |
| 4,696,004 | 9/1987 | Nakajima | 371/25.1 |
| 4,728,883 | 3/1988 | Green | 371/25.1 |
| 4,888,715 | 12/1989 | Tada et al. | 364/579 |
| 4,961,191 | 10/1990 | Nakagawa et al. | 371/22.1 |
| 5,161,160 | 11/1992 | Yaguchi et al. | 371/22.34 |
| 5,381,421 | 1/1995 | Dickol et al. | 371/25.1 |
| 5,673,274 | 9/1997 | Yoshida | 371/22.1 |

*Primary Examiner*—John E. Barlow, Jr.
*Assistant Examiner*—Bryan Bui
*Attorney, Agent, or Firm*—Muramatsu & Associates

[57] ABSTRACT

A software structure in a semiconductor test system for easily modifying and transferring data for controlling a hardware when the hardware is changed or replaced. The semiconductor test system includes, an input for providing a test program for specifying various test conditions necessary to test the semiconductor device under test, a master processor for converting the test program to an object code and interpreting the contents of the test program, a processor interface for storing data indicating the hardware characteristics of the semiconductor test system in a table format to assist the interpretation of the test program in the master processor and modifying the table format data in response to the change in the hardware, a library having data tables based on the specification of the semiconductor test system for converting the format of the data compiled and interpreted by the master processor to data of a hardware format, and a driver for transmitting the hardware format data to registers in the hardware of the semiconductor test system through a data bus.

3 Claims, 3 Drawing Sheets

SEMICONDUCTOR TEST SYSTEM

FIELD OF THE INVENTION

This invention relates to a semiconductor test system for testing semiconductor devices such as an IC, and more particularly, to a semiconductor test system which is capable of easily modifying a software when there is a change in a hardware of the semiconductor test system and easily expanding a software with a minor change when a hardware of the test system is expanded.

BACKGROUND OF THE INVENTION

In a semiconductor test system for testing semiconductor devices, a test signal pattern called a test vector is provided to a semiconductor device under test and a resultant output from the semiconductor device is compared with an expected signal established in advance to determined whether the semiconductor device under test works correctly or not. Generally, the test vector is produced through a test program. The languages in the test program are unique to manufacturers of the semiconductor test system and vary from manufacture to manufacture. To sufficiently test complicated computer chips or large scale semiconductor memories, for example, a semiconductor test system must perform complicated and sophisticated test at high speed. Therefore, an actual structure of the semiconductor test system has a structure of a large scale computer system. Consequently, a large scale software including the above noted test program is used to control the test and other operations of the semiconductor test system.

Because of the rapid improvement in the technology of the semiconductor devices, a semiconductor test system for testing such rapidly changing semiconductor devices frequently need to be expanded, modified or replaced with a new model. For example, in a test pattern generator of a semiconductor test system which generates test vectors, in addition to the function of generating a test pattern of a relatively normal and simple sequence, an algorithmic pattern generator may be added to generate a test pattern having mathematical sequence. In such a situation where the change or addition of the hardware resources is made, it is necessary to modify the software accordingly to control the hardware newly added or modified. This is usually made by transferring the appropriate data to internal registers in the newly added or modified hardware.

In the conventional technology, such a modification of the software in accordance with the change in the hardware is not easily carried out. For example, in such a situation, the conventional technology requires a complicated modification procedure of the software and thus involves long works. An example of such a conventional technology is shown in FIG. 3. This example is a conventional technology for the assignee of the present invention and used in the semiconductor test system produced and soled by the assignee.

A test program 11 is a program described by a test description language (also be refereed to as "ATL") which is formed by languages of Fortran, Basic and the like. The test program 11 has a form of source code through which, if necessary, users specify the operation of the hardware of the semiconductor test system by setting data such as test parameters. An interface 13 has a compiler function for converting the source code of the test program ATL to the object code. The interface 13 also has a function of data conversion by interpreting the object code and sending the object code to the corresponding hardware. A bus driver 15 provides the data converted by the interface 13 to a bus in the semiconductor test system for transmitting the data to registers in the hardware.

Assuming that there is a change in the hardware of the semiconductor test system, such as an addition in the hardware, and thus the necessary data is going to be transferred to a register 18 in the newly added hardware. In such a situation, the test parameters or other data will be described in the test program which includes operations of the newly added hardware. Based on the description in the test program, data for controlling the newly added hardware must be transferred to the register 18. To accomplish this process by the conventional technology, the program in the interface 13 must be changed.

Since the interface 13 has the compiler function as noted above, the contents of the program are basically lists of binary data which are complicated and large volume. This compiler function and the functions of interpreting the object code converted by the compiler function and converting the data for the hardware are not separately formed in the software. Therefore, in the conventional technology, even for a relatively simple modification of the hardware such as the addition of the hardware as noted above, the corresponding change in the interface 13 for controlling the modified hardware requires long and complicated works. Further, because the change in the interface 13 requires the complicated works, only limited software engineers having special knowledge, such as compiler software engineers, can carry out the software change. Because the program in the compiler part of the interface 13 is complicated and large scale, there is a need that such a modification in the interface 13 be avoided in the modification of the hardware except for a special occasion such as a modification of the grammatical change in the program language.

SUMMARY OF THE INVENTION

Therefore, it is an object of the present invention to provide a semiconductor test system which is capable of easily and quickly modifying the software for controlling the new hardware when the hardware resources in the semiconductor test system are modified by, for example, the addition or replacement.

It is another object of the present invention to provide a semiconductor test system which is capable of pursuing the modification of the software for controlling the new hardware without needs to consider the compiler function when the hardware resources in the semiconductor test system are modified.

It is a further object of the present invention to provide a software structure for a semiconductor test system which is capable of easily and quickly using the software resources obtained in the production or application processes of the semiconductor test system to a separate system such as a new type semiconductor test system.

In the semiconductor test system of the present invention, a test signal is applied to a semiconductor device under test in synchronism with a reference period and the resultant output of the semiconductor device under test is compared with an expected value to determine whether the semiconductor device functions correctly or not. The semiconductor test system includes:

means for providing a test program for specifying various test conditions necessary to test the semiconductor device under test including a waveform of a test signal to be supplied to a predetermined terminal of the semiconductor device under test, compiler means for converting the test program to object an code and interpreting the contents of the test program, compiler interface means for storing data indicating the hardware characteristics of the semiconductor test system in a table format to assist the interpretation of the test program in the compiler means and modifying the table format data in response to the change in the hardware, library means having data tables based on the specification of the semiconductor test system for converting the format of the data compiled and interpreted by the compiler means to data of a hardware format, and driver means for transmitting the hardware format data to a data bus to transfer the data to registers in the hardware of the semiconductor test system.

According to the present invention, when there is a change or replacement in the hardware of the semiconductor test system, the semiconductor test system of the present invention can easily and quickly modify the software for controlling the newly added or replaced hardware. Further, when there is a change or replacement in the hardware, the semiconductor test system of the present invention can carry out the modification of the software for controlling the new hardware without needs to consider the compiler. Moreover, in the present invention, it is able to easily and efficiently make use of the software resources obtained through the production and usage of the semiconductor test system to a separate system such as a new type semiconductor test system.

DETAILED DESCRIPTION OF THE PREFERRED EMBODIMENT

The semiconductor test system of the present invention makes it possible to set a control program corresponding to the replacement or addition of the hardware by simply providing additional data in a sentence format on a table as well as adding library data. Such a modification of the control program is independent of the compiler function. An embodiment of the semiconductor test system of the present invention is shown in FIG. 1.

Figure 1:
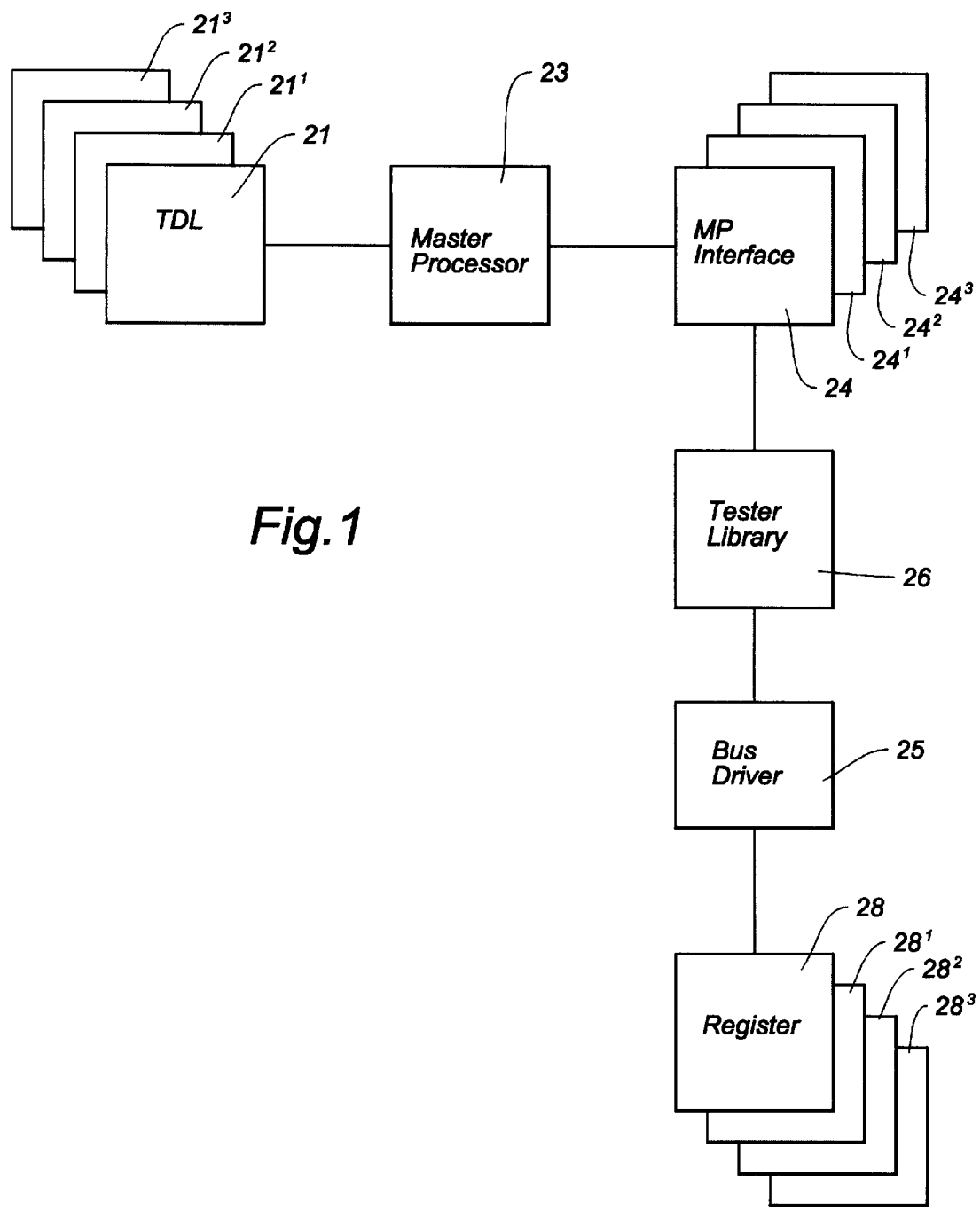
FIG. 1 is a block diagram showing a software structure of the present invention for responding to the change in the hardware of the semiconductor test system.

The example of FIG. 1 is formed of a test program 21, a master processor 23, a master processor (MP) interface 24, a tester library 26 and a bus driver 25. By this arrangement, the compilation and interpretation of the test program is pursued by the master processor 23 independently from the data regarding the structure of the hardware in question. In other words, the master processor 23 is not directly involved in the procedures of transferring the control data for carrying out the test to the register in the hardware.

Figure 3:
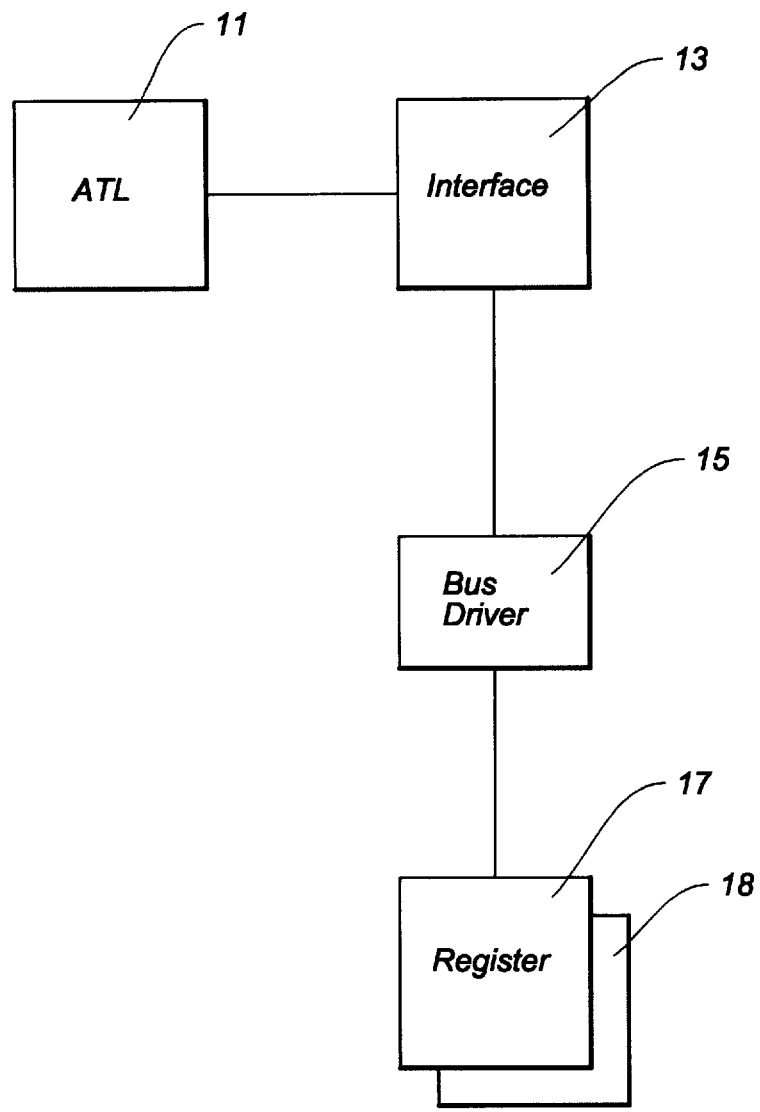
FIG. 3 is a block diagram showing a software structure of the conventional technology for responding to the change in the hardware of the semiconductor test system.

In the example of FIG. 1, similar to the situation in FIG. 3, the test program 21 is a program described by a test description language (also be referred to "TDL"). The test description language is structured by a hardware description language such as HDL or VHDL. The test program has a form of source code. The user provides necessary test parameters in the test program to define the test operation in the hardware of the semiconductor test system. When the hardware is modified or added, the structure of the test description language (TDL) involving the test of the hardware is modified accordingly.

The master processor (also be referred to as "MP") 23 is basically a compiler which is called as a TDL compiler or just-in-time compiler by the assignee of the present invention. The master processor 21 converts the test program TDL which is the source code to the object code and interprets the test program. The master processor 21 then provides the control data to the corresponding hardware of the semiconductor test system. Therefore, the master processor works as a binary data mapping function and the internal structure of which is a large list of binary data forming the object code.

The MP interface (also be referred to as "MPI") 24 works as a table mapping function for providing data necessary for the interpretation to the master processor 21. The table map of the MP interface 24 includes a list of data having a sentence format. The new data corresponding to the addition or modification of the hardware is made by adding a table in the MP interface 24. In receiving the information regarding the data structure and its acquiring points from the MP interface 24, the master processor 21 performs the compilation and interpretation operations for the test program based on the information. The resultant data from the master processor 21 and the corresponding table data from the MP interface 24 are received by the tester library 26.

The tester library 26 is a library which stores data concerning the hardware of the semiconductor test system in a table format. The tester library 26 converts the format of the data from the MP interface 24 based on the specifics of the hardware. For example, the required data for the hardware may be aligned corresponding to the physical position or order of the hardware (such as test pins). Further, the actual limiting parameters corresponding to the test program are defined based on the limits of the parameters, such as voltage, current, frequency, etc. for each of the hardware of the semiconductor test system. The bus driver 25 is a driver for sending data to each of the registers in the hardware of the semiconductor test system through a data bus.

In the configuration of the present invention, as an initial data setting, data based on hardware of semiconductor test system of imaginary model is load in the master processor 23. The master processor inquires hardware functions of the present semiconductor test system. If a hardware is newly added, data corresponding to such an addition is provided to the MP interface 24. The master processor interpret the test program with the aids of the newly added data from the MP interface. Therefore, the hardware is automatically added to the imaginary model of the semiconductor test system.

As an example, it is assumed in the following that hardware is newly added to the semiconductor test system and thus it is necessary to store the control data to registers $28^1$, $28^2$ and $28^3$ in the new hardware as shown in FIG. 1. Corresponding to the newly added hardware, tables $24^1$, $24^2$ and $24^3$ are added in the MP interface. The contents of the tables are, for example, data in a sentence form describing the addresses of test pins corresponding to the hardware, data showing the voltage or current of test signals and the like.

Ordinarily, according to the change in the hardware, it is necessary to change the structure of the test program. In such a case, as shown in FIG. 1, test programs $21^1$, $21^2$ and $21^3$ are added, if necessary. The tester library 26 produces a parameter table, as a source program, for data conversion corresponding to the specifics of the new hardware. The tester library is described, for example, in a C-language.

In receiving the newly acquired data in the tables $24^1$, $24^2$ and $24^3$ from the MP interface, the master processor 21 interprets the program from the test program 21 based on the table data. Since the test programs $21^1$, $21^2$ and $21^3$ are added when necessary, the compilation and interpretation of these test programs are carried out by the master processor based on the corresponding data of the tables $24^1$, $24^2$ and $24^3$ from the MP interface. The resulted object codes are provided to the tester library 26 through the MP interface. The tester library 26 converts the format of the received object codes produced through the data of the tables $24^1$, $24^2$ and $24^3$ of the MP interface based on the parameter tables as noted above to a hardware format, and supplied the format converted object codes to the bus driver 25. As a result, the control data is stored in the registers $28^1$, $28^2$ and $28^3$ in the hardware through the bus driver 25.

Figure 2:
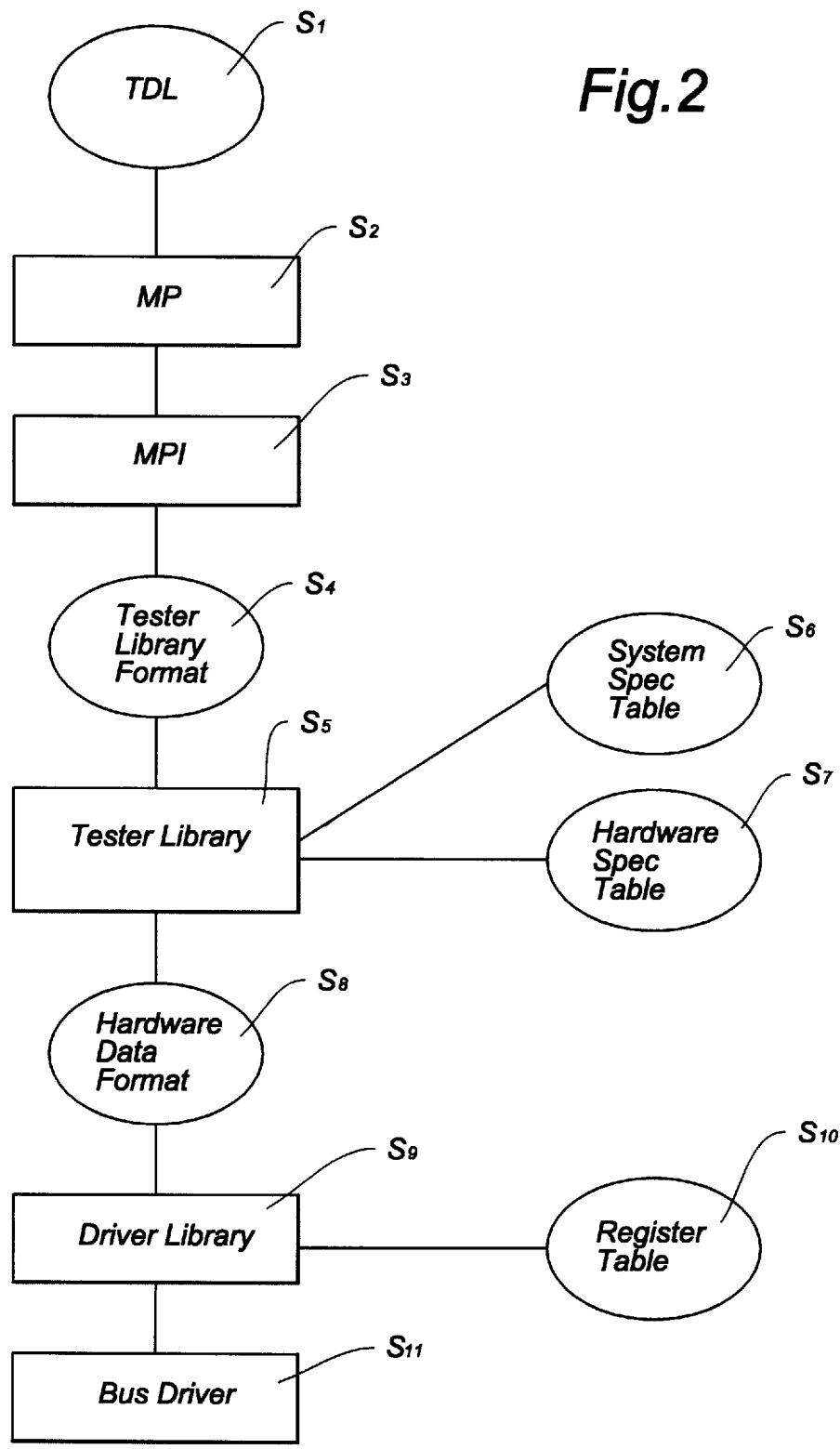
FIG. 2 is a flow chart showing operations by the software structure of the present invention of FIG. 1.

FIG. 2 is a flow diagram showing an example of operation in the present invention. In this diagram, it is described, with emphasis on the data flow, how the test program described in the TDL is processed to control the hardware of the semiconductor test system. Simply stated, the control data for the semiconductor test system described in the TDL test program is converted to the form suitable for the registers, and stored in the registers of the semiconductor test system through the bus driver. In the flow chart, the oval shape designates data and the rectangular shape designates execution of the program.

The TDL test program defined in the step S1 is compiled and interpreted by the master processor in the step S2. The data for controlling the hardware is provided with the specific character of the newly added hardware by the MP interface in the step S3. In the step S4, the data in the tester library format is produced. The program in the tester library data format is executed and converted to data of the hardware format in the step S8. The tester library is also provided with the table data based on the system specification in the step S6 and the table data based on the hardware specification in the step S7. The data in the hardware format created in the step S8 is undertaken a driver library process in the step S9. In the driver library, it is provided with register tables corresponding to the hardware in the step S10. In the step S11, the data from the driver library is transferred to the registers by the execution of the bus driver.

As in the foregoing, according to the present invention, when there is a change or replacement in the hardware of the semiconductor test system, the semiconductor test system of the present invention can easily and quickly modify the software for controlling the newly added or replaced hardware. Further, when there is a change or replacement in the hardware, the semiconductor test system of the present invention can carry out the modification of the software for controlling the new hardware without needs to consider the compiler. Moreover, in the present invention, it is able to easily and efficiently make use of the software resources obtained through the production and usage of the semiconductor test system to a separate system such as a new type semiconductor test system.

What is claimed is:

1. A semiconductor test system for testing a semiconductor device by applying a test signal to a semiconductor device under test in synchronism with a reference period and comparing the resultant output of the semiconductor device under test with an expected value to determine whether the semiconductor device functions correctly or not, comprising:

test program input means for providing a test program to specify various test conditions necessary to test the semiconductor device including a waveform of a test signal to be supplied to a predetermined terminal of the semiconductor device under test, the test program being changed in its test description format when there is a change in hardware of the semiconductor test system;

compiler means for compiling and interpreting the test program to convert the test program to object codes;

compiler interface means for storing data indicating the hardware characteristics of the semiconductor test system in a table format to assist the compilation and interpretation of the test program in the compiler means;

library means having data tables based on the specification of the semiconductor test system for converting the data compiled and interpreted by the compiler means to hardware format data, and driver means for providing the hardware format data to a data bus to transfer the data to registers in the hardware of the semiconductor test system;

wherein, the library means is provided with new parameters corresponding to the change in the hardware of the semiconductor test system, and the data in the table format in the compiler interface means is modified in response to the new parameters in the library means, thereby the chance in the test description format is converted to object codes by the compiler means with use of modified data in the compiler interface means.

2. A semiconductor test system for testing a semiconductor device as defined in claim 1, further includes driver library means having data tables based on the physical specification of a register in the hardware for converting the data from the library means to data of a format to be stored in the register.

3. A semiconductor test system for testing a semiconductor device by applying a test signal to a semiconductor device under test in synchronism with a reference period and comparing the resultant output of the semiconductor device under test with an expected value to determine whether the semiconductor device functions correctly or not, comprising:

a test program input for providing a test program to specify various test conditions necessary to test the semiconductor device including a waveform of a test signal to be supplied to a predetermined terminal of the semiconductor device under test, the test program being changed in its test description format when there is a change in hardware of the semiconductor test system;

a master processor for converting the test program to object codes through compilation and interpretation process;

a processor interface for storing data indicating the hardware characteristics of the semiconductor test system in a table format to assist the compilation and interpretation of the test program in the master processor;

a library having data tables based on specifications of the semiconductor test system for converting the data compiled and interpreted by the master processor to hardware format data, and a driver for providing the hardware format data to a data bus to transfer the data to registers in the hardware of the semiconductor test system;

wherein, the library is provided with new parameters corresponding to the change in the hardware of the semiconductor test system, and the data in the table format in the processor interface is modified in response to the new parameters in the library, thereby the change in the test description format is converted to object codes by the master processor with use of modified data in the processor interface without any changes in the master processor.

* * * * *